March 17, 1953 A. E. CHELGREN 2,632,109

UNI-CONTROL MECHANISM FOR SIMULTANEOUSLY ADJUSTING
A PLURALITY OF TUNING ELEMENTS
Filed Dec. 22, 1950

INVENTOR.
ARVID E. CHELGREN
BY Francis W. Crotty
HIS ATTORNEY

Patented Mar. 17, 1953

2,632,109

UNITED STATES PATENT OFFICE 2,632,109

UNI-CONTROL MECHANISM FOR SIMULTANEOUSLY ADJUSTING A PLURALITY OF TUNING ELEMENTS

Arvid E. Chelgren, Elmhurst, Ill., assignor to Zenith Radio Corporation, a corporation of Illinois Application December 22, 1950, Serial No. 202,227

6 Claims. (Cl. 250—40)

This invention relates to an improved uni-control mechanism for simultaneously adjusting a plurality of tuning elements included in a wave-signal translating apparatus and is especially suited for use in a superheterodyne receiver for tuning the tracking circuits through predetermined frequency ranges in a manner to provide a substantially constant frequency difference therebetween.

Although the invention may be employed with a variety of tuning elements, it is ideally suited for uni-controlling a plurality of adjustable tuning inductors individually comprising a cylindrical coil and a tuning member of conductive material supported in coaxial alignment with the coil for movement into and out of one end thereof to constitute therewith a variable condenser. Such a tuning device, per se, is disclosed in the copending application of Arvid E. Chelgren, Serial No. 146,845, filed February 28, 1950, now Patent No. 2,595,764 granted May 6, 1952, and assigned to the same assignee as the present application.

The problem of uni-controlled adjustment of a plurality of tunable devices is exceedingly old in the receiver art and is encountered in all superheterodyne receivers where it is necessary to accomplish simultaneous tuning of radio-frequency selectors and the heterodyne oscillator while maintaining a preselected frequency relation between the tunable stages over the desired range of operating frequencies. Usually, each of the tunable stages has a principal tuning reactance, such as a variable inductor or condenser, and the uni-control mechanism adjusts those reactances. In most instances, however, this sort of arrangement provides the precise frequency relation of the tunable stages over but a small portion of the operating range and it is necessary to resort to the use of trimmer and/or padder condensers in an effort to achieve tracking, that is, a relatively fixed frequency relation of the tunable stages over the entire operating range. With such auxiliary tuning aids tracking may be approximated but it is desirable to effect precise tracking without trimmer condensers and the like while at the same time providing a tuning system that is flexible.

It is an object of this invention, therefore, to provide an improved uni-control mechanism for simultaneously adjusting a plurality of tuning elements.

It is another object of the invention to provide an improved uni-control mechanism for adjusting a plurality of tunable devices to produce a constant frequency difference therebetween throughout a relatively wide tuning range.

Accordingly, the invention provides a uni-control mechanism for simultaneously displacing a plurality of movable tuning elements and is adapted to be included in a wave-signal translating apparatus. The uni-control mechanism comprises a mounting base and a plurality of lever-arms supported by the base for pivotal movement about a common reference axis. Each of the lever-arms includes a portion for mechanically engaging an assigned one of the tuning elements. A corresponding plurality of adjustably fixed elements are individually disposed between the reference axis and the engaging portion of an assigned one of the lever-arms; these elements determine the effective distance from the reference axis to the engaging portions. An actuator in mechanical coupling engagement with the lever-arms effects concurrent displacement of the lever-arms about the reference axis.

The features of the present invention which are believed to be novel are set forth with particularity in the appended claims. The present invention itself, both as to its organization and manner of operation, together with further objects and advantages thereof may best be understood by reference to the following description taken in connection with the accompanying drawings in which:

Figure 1:
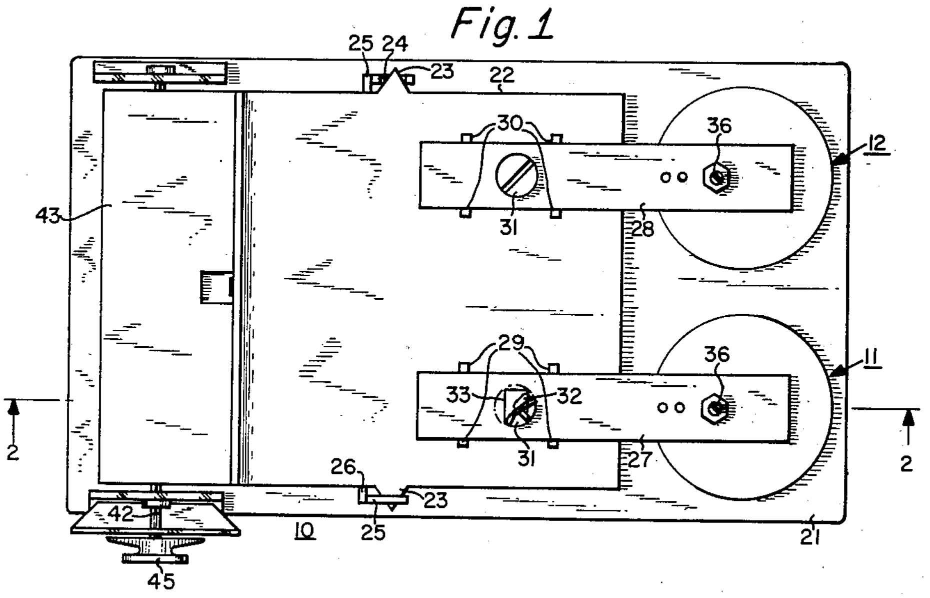
Fig. 1 is a plan view of a uni-control mechanism in accordance with the invention.

Referring now to Fig. 1, the uni-control mechanism 10, constructed in accordance with the instant invention, is associated with the tuning elements of a wave-signal translating apparatus such as a receiver of the superheterodyne type. The units 11 and 12 when considered as part of a superheterodyne receiver may constitute a tunable radio-frequency selector and the frequency-determining circuit of the local or heterodyne oscillator. Since the circuitry of that type receiver is thoroughly understood in the art and constitutes no part of the present invention, the remainder of the receiving apparatus has been omitted from the drawing and the following description will be limited to the tunable devices 11 and 12 and the uni-control mechanism for adjusting them. Of course, in many applications and even in particular superheterodyne receiver designs it is necessary to have the uni-control system extend to three or more tunable devices but, for the sake of simplicity, it is shown only in relation to a pair of tuning elements. Its extension to any number of such elements will be manifest from the discussion of the specific illustration. Moreover, for convenience, elements 11 and 12 will be assumed to be identical in construction.

Figure 2:
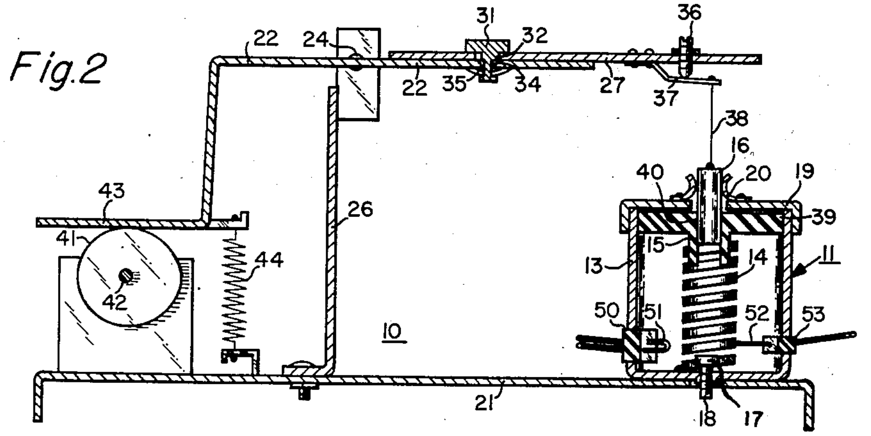
Fig. 2 is a sectional view taken along line 2—2 of Fig. 1.

As shown in Fig. 2, each of the tuning devices includes a pair of relatively movable components represented by an inductor 14 and an associated tuning core 16. Each such inductor comprises a plurality of conductive spirally-wound self-supporting turns while the tuning core is a cylinder or rod of electrically conductive but non-magnetic material. To facilitate uni-controlled adjustment of these devices it is preferred that the inductors be supported in substantially parallel relation with one another as by mounting the inductors with their axes normal to a mounting base 21. The mounting arrangement for coil 14 of tuning device 11, for example, comprises a shield container 13 enclosing the inductors and affixed in any desired manner to base 21. The lowermost end of the inductor is electrically connected to the bottom closure portion of the container as indicated to support the inductor at that end. The opposite end of the inductor abuts against the shoulder of a member comprised of a disc 39 and a cylindrical portion 15 which projects into the top turns of coil 14. Member 15, 39 is formed of insulating material and has a central aperture in coaxial alignment with the internal bore of coil 14. A conductive cap 19 closes the corresponding end of container 13 and has a centrally located cluster of conductive fingers 20 for engaging tuning core 16. The channel formed by these fingers and the aperture of member 15, 39 constitute a guide determining the path of movement of the tuning core 16 relative to inductor 14. More specifically, this guide arrangement permits movement of the core axially of the coil, into and out of the upper end thereof. In order to vary the tuning characteristics of the tuning devices relative to each other, it is desirable to provide a further core member 17 at the lower end of the inductor. This core may also be constructed of electrically conductive but non-magnetic material and it is adjustably fixed in the base of shield 13 for inductance-trimming of inductor 14. A threaded rod 18 to which this core is attached passes through a threaded opening in the bottom of the shield and through an aligned opening in base 21. It is convenient to slot the exposed end of this rod so that the position of core 17 may be subject to screw-driver adjustment.

Electrical connections to the tuning device may be made in a variety of ways. As represented in Fig. 2, an insulating bushing 50 carrying an inductive loop 51 projects through one side opening of container 13 to couple the loop and the apparatus connected thereto (not shown) to coil 14. Another lead 52 is connected to a tap on coil 14 and extends through another insulating bushing 53 accommodated by a side opening of the container. Connections to this lead and to the shield container may be employed to couple the tuning device to the circuit components.

Figure 3:
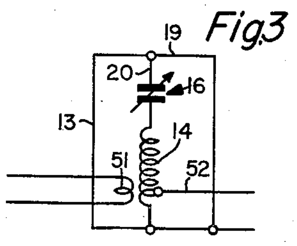
Fig. 3 represents the electrical equivalent of a portion of the apparatus shown in Fig. 1; and, Fig. 4 comprises curves representing certain electrical performance characteristics of a portion of the structure of Fig. 1.

This tuning device is similar to that described in the afore-mentioned copending application and its equivalent electrical circuit is represented in Fig. 2. This correspondence of circuit components between Figs. 2 and 3 is obvious except for the condenser of Fig. 3. The condenser has the tuning core 16 as one electrode and has the enveloping turns of inductor 14 as the other electrode with the coil form 15 serving as an intervening dielectric. The condenser is shown as variable because the effective areas of the electrodes and the capacitance exhibited are determined by the position of core 16 within inductor 14.

The uni-control mechanism 10 for simultaneously tuning devices 11 and 12 includes a carriage 22 having a pair of sidewardly extending, pointed projections 23. Each of these projections is received by an aperture 24 in a respective one of a pair of ears 25 of a bearing or pivot member 26 which extends upwardly from base 21 to provide a pivotal support for carriage 22. A plurality of levers 27 and 28 of adjustably fixed length are supported on the upper surface of carriage 22 for pivotal movement toward and away from the upper ends of the inductors of tuning devices 11 and 12. Each lever is also movable along the carriage 22 to adjust its effective length and guide means, such as projections 29 and 30 struck from carriage 22, engage the sides of the levers so that this movement is linear. A locking arrangement releasably locks each lever in adjusted position on the carriage.

The locking arrangement comprises a member 31 slotted for screw-driver adjustment and having a cam section 32 received in an opening 33 of its particular lever. An extension 34 of this member projects through an aperture of carriage 22 and is upset over a friction washer 35. The cam section 32 is eccentric relative to the extension 34 and rotation of the cam displaces the associated lever along its longitudinal axis and relative to carriage 22. The friction washer maintains the lever in any of its adjusted positions so that the lever may be said to have an adjustably fixed length.

Preferably, the free end of each lever 27 and 28 overlies one of the tuning elements 11 and 12 and has a threaded opening receiving a screw 36. A leaf spring 37 is fixed to the underside of each lever and is biased against the lower extremity of a respective one of screws 36. An individual flexible coupler 38, which preferably is constructed of a stiff, resilient wire, such as piano wire, extends from the free extremity of each spring 37 to the upper end of the particular tuning core 16 aligned with each lever. In other words, each coupler suspends one tuning core at an adjustably fixed distance from the free end of one of the actuating levers 27 and 28 to effect axial displacement of the tuning core in response to pivotal movement of its actuating lever. The adjustment permitted by the screws 36 is also useful in correlating the frequency characteristics of the several tuning devices, as will be described hereinafter.

The uni-control mechanism further includes means supported by base 21 for simultaneously displacing levers 27 and 28 about their common pivotal axis defined by the upper edge of support member 26 simultaneously to displace the tuning cores 16 of tuning elements 11 and 12 along their respective paths. This means comprises a cam 41 carried by a shaft 42 rotatably supported in suitable bearings mounted on base 21 for rotation about an axis parallel to member 26 but on the side thereof opposite tuning devices 11 and 12. The carriage 22 has a horizontally disposed cam-follower portion 43 maintained in engagement with cam 41 by a bias spring 44. A control knob 45 attached to one end of shaft 42 facilitates controlled rotation of the shaft. It is evident that the distance through which each tuning core 16 is displaced as cam 41 turns with shaft 42 depends upon the distance from the pivot defined by aperture 24 of member 26 to the coupler 36, 38 of each core. This distance is adjustable by the members 31 which vary the effective lengths of the actuating levers 27, 28. It is apparent that by suitably proportioning the distances from the pivotal axis of carriage 22 to the tuning cores and to the cam and follower 41, 43, the mechanical advantage of the lever so defined may be preset at any desired value.

Figure 4:
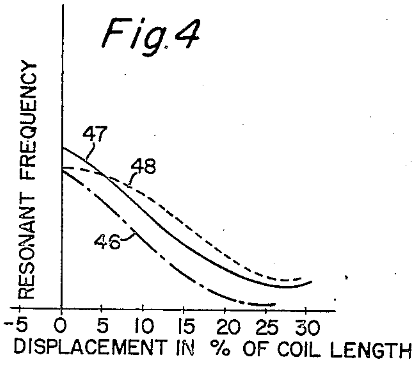

In considering the operation of the described arrangement, let it be assumed that curve 46 of Fig. 4 represents the frequency characteristic of one of the tuning devices, say unit 11, in terms of axial displacement of its tuning core 16. Since the position of the core depends on the position of cam 41, the curve also denotes the variation in resonant frequency with rotation of shaft 42. Assuming further that the tuning devices are in the radio-frequency and heterodyning units of a superheterodyne receiver, the proper frequency characteristic for device 12 is represented by curve 47 but, before the system is adjusted, the frequency of device 12 with rotation of shaft 42 may vary as indicated in curve 48. Where this characteristic is obtained, the frequency separation of devices 11 and 12 is too small at one end of the operating range and the separation is too irregular. By adjustment of the auxiliary core 17 of unit 12, the desired separation may be obtained at the high-frequency end of the range. Moreover, turning members 31 to adjust the relative lengths of the levers 27 and 28 permits the devices to tune over suitable ranges of frequency and adjustment of the coupler screws 36 enables the required frequency separation or tracking to be realized. While generally the adjustments are not entirely independent of one another, the system has a sufficient number of degrees of freedom to achieve efficient tracking with a relatively simple control mechanism.

While a particular embodiment of the present invention has been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. In a wave-signal translating apparatus, a uni-control mechanism for simultaneously displacing a plurality of movable tuning elements, said uni-control mechanism comprising: a mounting base; a plurality of lever-arms supported by said base for pivotal movement about a common reference axis and individually having a portion for mechanically engaging an assigned one of said tuning elements; a corresponding plurality of adjustably fixed elements individually disposed between said reference axis and said portion of an assigned one of said lever-arms for determining the effective distance from said reference axis to said portion of its associated lever arm; and an actuator in mechanical coupling engagement with said plurality of lever-arms for effecting concurrent displacement of said lever-arms about said reference axis.

2. In a wave-signal translating apparatus, a uni-control mechanism for simultaneously displacing a plurality of movable tuning elements, said uni-control mechanism comprising: a mounting base; a plurality of lever-arms supported by said base for pivotal movement about a common reference axis; a corresponding plurality of coupling devices individually adjustably fixed to a respective one of said lever-arms for mechanically linking said lever-arm to an assigned one of said tuning elements and for adjusting the effective distance between said lever-arm and said tuning element; a corresponding plurality of adjustably fixed elements individually disposed between said reference axis and said coupling devices for determining the effective distance from said reference axis to each of said coupling devices; and an actuator in mechanical coupling engagement with said plurality of lever-arms for effecting concurrent displacement of said lever-arms about said reference axis.

3. In a wave-signal translating apparatus, a uni-control mechanism for simultaneously displacing a plurality of movable tuning elements, said uni-control mechanism comprising: a mounting base; a plurality of lever-arms supported by said base for pivotal movement about a common reference axis; a corresponding plurality of resilient coupling devices individually adjustably fixed to a respective one of said lever-arms for mechanically linking said lever-arm to an assigned one of said tuning elements and for adjusting the effective distance between said lever-arms and said tuning element; a corresponding plurality of adjustably fixed elements individually disposed between said reference axis and said resilient coupling devices for determining the effective distance from said reference axis to each of said resilient coupling devices; and an actuator in mechanical coupling engagement with said plurality of lever-arms for effecting concurrent displacement of said lever-arms about said reference axis.

4. In a wave-signal translating apparatus, a uni-control mechanism for simultaneously displacing a plurality of movable tuning elements, said uni-control mechanism comprising: a mounting base; a plurality of lever-arms supported by said base for pivotal movement about a common reference axis; a plurality of guides supported by said base for limiting movement of said tuning elements to a predetermined path; a corresponding plurality of coupling devices individually adjustably fixed to a respective one of said lever-arms for mechanically linking said lever-arm to an assigned one of said tuning elements and for adjusting the effective distance between said lever-arm and said tuning element; a corresponding plurality of adjustably fixed elements individually disposed between said reference axis and said coupling devices for determining the effective distance from said reference axis to each of said coupling devices; and an actuator in mechanical coupling engagement with said plurality of lever-arms for effecting concurrent displacement of said lever-arms about said reference axis.

5. In a wave-signal translating apparatus, a uni-control mechanism for simultaneously displacing a plurality of movable tuning elements, said uni-control mechanism comprising: a mounting base; means, including a carriage supported by said base for pivotal movement about a reference axis, providing a plurality of lever-arms individually having a portion for mechanically engaging an assigned one of said tuning elements; a corresponding plurality of adjustably fixed elements supported by said carriage and individually disposed between said reference axis and said portion of an assigned one of said lever-arms for determining the effective distance from said reference axis to said portion of its associated lever-arm; and an actuator in mechanical coupling engagement with said plurality of lever-arms for effecting concurrent pivotal displacement of said lever-arms about said reference axis.

6. In a wave-signal translating apparatus, a uni-control mechanism for simultaneously displacing a plurality of movable tuning elements, said uni-control mechanism comprising: a mounting base; means, including a carriage supported by said base for pivotal movement about a reference axis, providing a plurality of lever-arms individually having a portion for mechanically engaging an assigned one of said tuning elements; a corresponding plurality of cams adjustably supported by said carriage and individually disposed between said reference axis and said portion of an assigned one of said lever-arms for determining the effective distance from said reference axis to said portion of its associated lever-arm; and an actuator in mechanical coupling engagement with said plurality of lever-arms for effecting concurrent pivotal displacement of said lever-arms about said reference axis.

ARVID E. CHELGREN.

REFERENCES CITED

The following references are of record in the file of this patent:

UNITED STATES PATENTS

| Number | Name | Date |
|---|---|---|
| 2,137,435 | Yolles | Nov. 22, 1938 |
| 2,483,105 | Rennick | Sept. 27, 1949 |
| 2,518,930 | Polydoroff | Aug. 15, 1950 |